United States Patent
Palm et al.

(10) Patent No.: US 6,601,202 B2
(45) Date of Patent: Jul. 29, 2003

(54) CIRCUIT CONFIGURATION WITH DEACTIVATABLE SCAN PATH

(75) Inventors: Herbert Palm, Höhenkirchen (DE); Michael Smola, München (DE); Stefan Wallstab, München (DE)

(73) Assignee: Infineon Technologies AG, Munich (DE)

( * ) Notice: Subject to any disclaimer, the term of this patent is extended or adjusted under 35 U.S.C. 154(b) by 112 days.

(21) Appl. No.: 09/820,250

(22) Filed: Mar. 28, 2001

(65) Prior Publication Data

US 2001/0025355 A1 Sep. 27, 2001

Related U.S. Application Data

(63) Continuation of application No. PCT/EP99/07189, filed on Sep. 28, 1999.

(30) Foreign Application Priority Data

Sep. 28, 1998 (EP) .............................................. 98118302

(51) Int. Cl.$^7$ ............................................... G01R 31/28
(52) U.S. Cl. ................................................ 714/726
(58) Field of Search ................................. 714/726, 727, 714/729, 733, 731; 326/8, 40–41, 46, 39, 38, 37; 711/138, 163; 380/277, 30, 52; 324/763, 765; 713/183, 17, 191; 341/100

(56) References Cited

U.S. PATENT DOCUMENTS

| | | | |
|---|---|---|---|
| 3,761,695 A | | 9/1973 | Eichelberger |
| 4,534,028 A | | 8/1985 | Trischler .................... 714/731 |
| 5,530,749 A | * | 6/1996 | Easter et al. ................. 713/191 |
| 5,627,478 A | * | 5/1997 | Habersetzer et al. ........ 324/763 |
| 5,760,719 A | * | 6/1998 | Graf ............................. 341/100 |
| 5,898,776 A | * | 4/1999 | Apland et al. .................. 326/8 |
| 6,499,124 B1 | * | 12/2002 | Jacobson ..................... 714/727 |

FOREIGN PATENT DOCUMENTS

| | | | | |
|---|---|---|---|---|
| DE | 27 38 113 A1 | | 3/1978 | ............ G07C/9/00 |
| DE | 196 04 776 A1 | | 8/1997 | ......... H01L/27/112 |
| DE | 197 11 478 A1 | | 10/1998 | ........... G06F/12/14 |
| WO | WO 97/29515 | | 8/1997 | ......... H01L/25/535 |

OTHER PUBLICATIONS

NN86091575 (Method to Reconfigure Logic Signal Paths; IBM Technical Disclosure Bulletin; vol. #:29 Issue # 4, pp. 1575–1578; Sep. 1, 1986).*

* cited by examiner

*Primary Examiner*—Albert Decady
*Assistant Examiner*—Guy Lamarre
(74) *Attorney, Agent, or Firm*—Laurence A. Greenberg; Werner H. Stemer; Ralph E. Locher

(57) ABSTRACT

A circuit configuration with a deactivatable scan path, includes a number of function blocks each connected to at least one other of the function blocks. At least one sub-set of the connections is in the form of a respective interlocking element which can be switched through an activation line (Scan Enable) from a normal mode to a test mode and which has a further data input and data output. The further data inputs and outputs are connected to one another by data line sections in such a manner that the interlocking elements form a shift register which provides a scan path. At least one electrically programmable protection element, which either interrupts a given line or connects it to a defined potential, is disposed along the activation line (Scan Enable) and/or the data line sections.

4 Claims, 2 Drawing Sheets

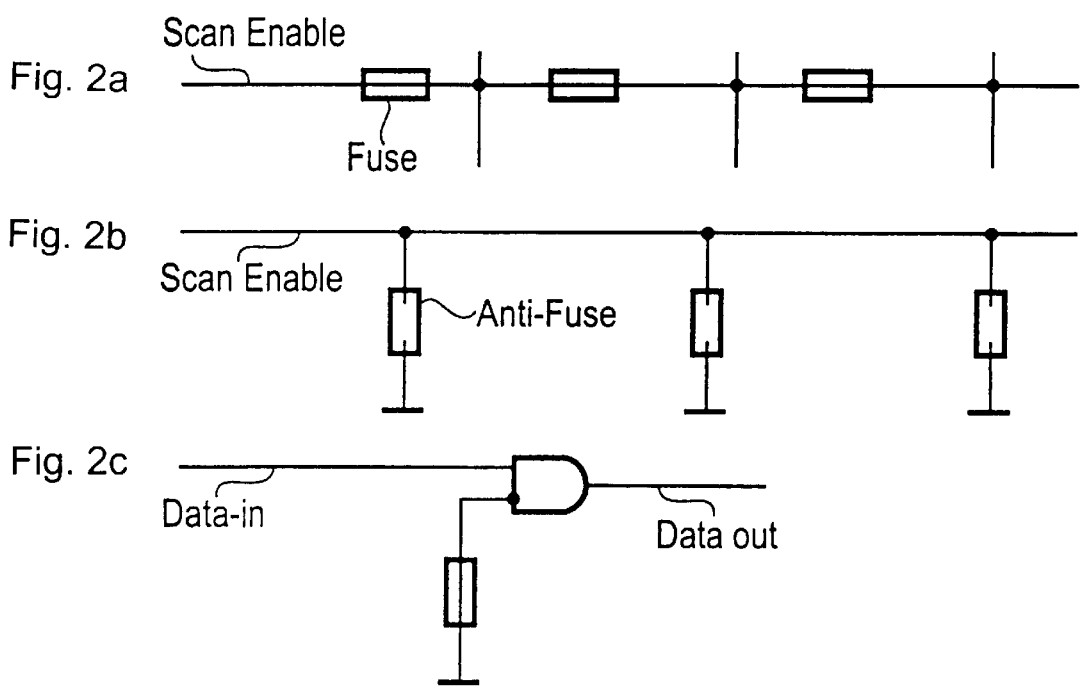

CIRCUIT CONFIGURATION WITH DEACTIVATABLE SCAN PATH

CROSS-REFERENCE TO RELATED APPLICATION

This application is a continuation of copending International Application No. PCT/EP99/07189, filed Sep. 28, 1999, which designated the United States.

BACKGROUND OF THE INVENTION

FIELD OF THE INVENTION

The invention relates to a circuit configuration having a number of function blocks each connected to at least another one of the function blocks. At least one sub-set of the connections is in the form of an interlocking element which can be switched through an activation line from a normal mode to a test mode and which has a further data input and data output. The further data inputs and outputs are connected to one another by data line sections in such a manner that the interlocking elements form a shift register which provides a scan path.

Such a circuit configuration is known from U.S. Pat. No. 4,534,028. A scan path which is described therein and is provided in the circuit configuration is used to simplify the testing of the function blocks in the circuit configuration.

The interlocking elements, which can be interconnected to form a shift register and are in the form of flipflops, allow defined input states to be applied to the individual function blocks at defined times, and also allow the intermediate results, which are stored in the interlocking elements, to be read once again through the shift register. In that case, one function block is intended to be a circuit unit which carries out a specific function that can itself be tested.

Specific forms of electronic circuits, such as circuits for smart cards, require a high level of secrecy of circuit information and chip-internal data, such as keys for cryptological procedures. That security-relevant information must be protected not only against analysis by third parties, but also against manipulation. At the same time, the circuit design requires a minimum level of transparency and access to such security-relevant circuit blocks and data, in order to ensure adequate reliability through the use of testing. In order to ensure a high level of test coverage during and after production, test components such as the scan path described above are frequently additionally integrated in the electronic circuit and allow a function block to be placed in virtually all of the desired states in order to test its functionality in that way.

The components which are introduced for testing in that case are often activated and deactivated by central test controllers. Those test controllers are activated either by software or through the use of external signals through specific test pins. Both versions are relatively simple to manipulate, and thus represent a potential security risk. The previously used procedures for improving the capability to analyze integrated circuits are thus not consistent with the high level of security now required of specific electronic components.

It is already known for specific function blocks in a circuit configuration to be irreversibly disconnected from the rest of the circuit after a test or after initially being brought into use.

For example, German Published, Non-Prosecuted Patent Application DE 197 11 478 A1, corresponding to U.S. application Ser. No. 09/398,694, filed Sep. 20, 1999, now abandoned has already described the capability to read a test ROM only through a multiplexer which can be selected irreversibly, in order to prevent access to the test ROM after the test.

German Published, Non-Prosecuted Patent Application DE 27 38 113 A1 has already disclosed irreversible prevention of access to memories with security-relevant and/or function relevant contents through the use of destructible gates.

However, the disadvantage of those known configurations is that the circuit components which can be selected or destroyed irreversibly are disposed at points that can be found easily, and which can be "repaired" relatively easily, thus allowing extensive analysis, and therefore manipulation.

SUMMARY OF THE INVENTION

It is accordingly an object of the invention to provide a circuit configuration with a deactivatable scan path, which overcomes the hereinafore-mentioned disadvantages of the heretofore-known devices of this general type in such a way that it is virtually impossible to use the scan path for unauthorized analysis.

With the foregoing and other objects in view there is provided, in accordance with the invention, a circuit configuration, comprising a number of function blocks having inputs and outputs. Connections connect the inputs and outputs of each of the function blocks to at least one other of the function blocks. The connections include at least one subset in the form of a respective interlocking element having a normal mode, a test mode, a further data input and a further data output. An activation line (Scan Enable) is provided for switching the interlocking element from the normal mode to the test mode. Data line sections connect the further data inputs and outputs to one another forming a shift register from the interlocking elements to provide a scan path. At least one electrically programmable protection element is disposed along the activation line (Scan Enable) and/or the data line sections for selectively interrupting and connecting a given one of the lines to a defined potential.

The interlocking elements of a scan path are distributed over the entire chip area. The activation line and a data line, which is composed of the data line sections, thus also run over the entire chip area. However, the protection elements are thus also distributed in a decentralized manner over the area of the chip, so that the security against "attacks" is very high. Furthermore, a suitable choice of technology allows a very high security level to be achieved against reprogramming of the protection elements. Examples of such protection elements are specified in German Published, Non-Prosecuted Patent Application DE 196 04 776 A1.

The choice of different protection elements as line sections which can be produced or disconnected, that is to say as "fuses" or as "anti-fuses" enhances security since an "attacker" does not know immediately what type of element is being used. The use of both types is also highly advantageous. The protection elements can also be used in conjunction with logic gates, in order to define the function of those gates as open or closed switches by definition of the potential.

Other features which are considered as characteristic for the invention are set forth in the appended claims.

Although the invention is illustrated and described herein as embodied in a circuit configuration with a deactivatable scan path, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2A, 2B and 2C are schematic circuit diagrams of exemplary embodiments of protection elements.

DESCRIPTION OF THE PREFERRED EMBODIMENTS

Figure 1:
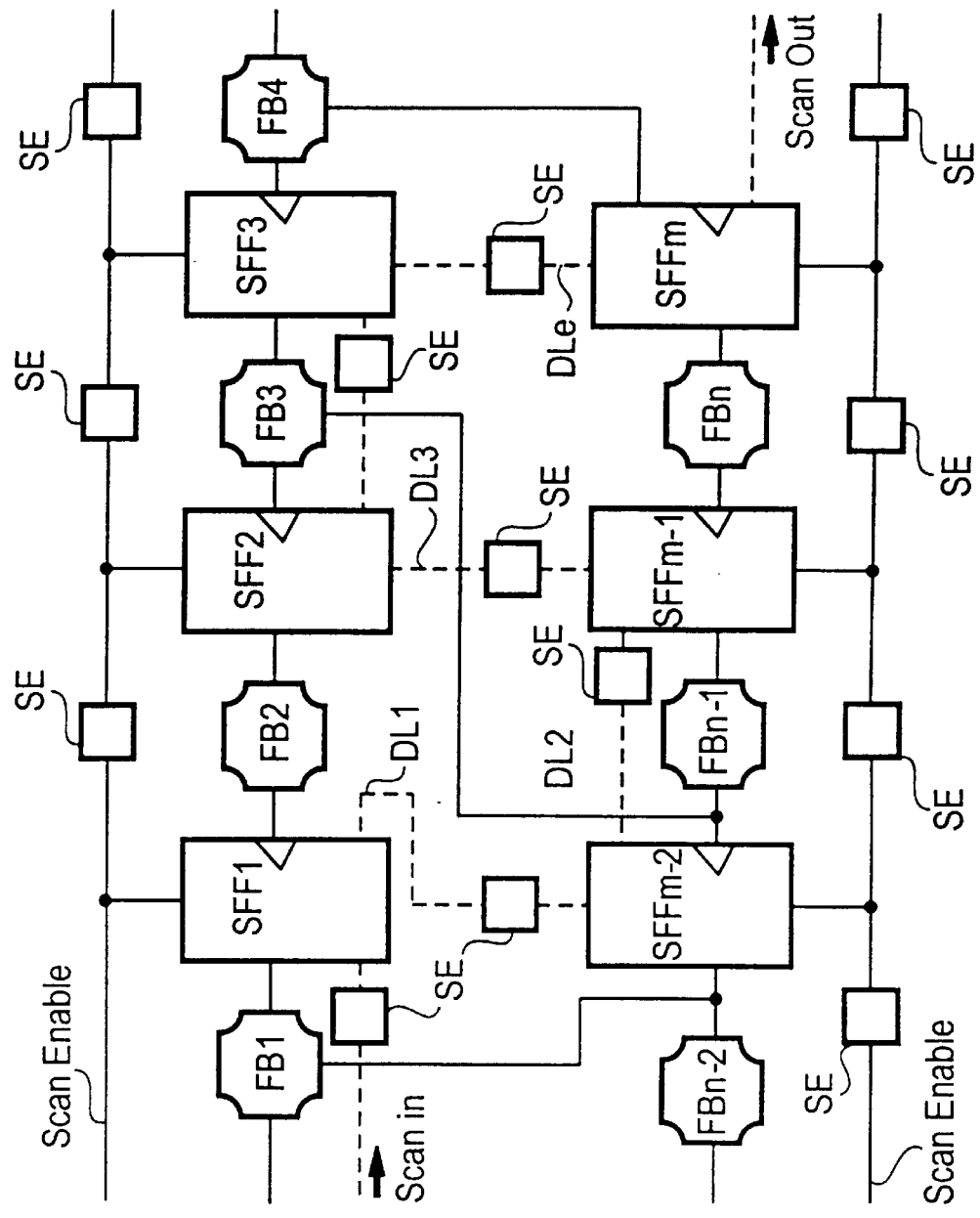
FIG. 1 is a schematic diagram of a circuit configuration according to the invention.

Referring now to the figures of the drawings in detail and first, particularly, to FIG. 1 thereof, there is seen a circuit configuration having function blocks FB1 . . . FBn which are connected to one another directly or through connecting elements SFF1 . . . SFFm. In this case, one function block can be connected to one or more other function blocks. The connection may be direct or through connecting elements in this case. The connecting elements SFF1 . . . SFFm are generally in the form of special flipflops referred to as scan flipflops.

Furthermore, the connecting elements SFF1 . . . SFFm can be switched through an activation line Scan Enable from a normal mode, in which they act as a route from an output of one function block to an input of the next function block, to a test mode. The connecting elements SFF1 . . . SFFm have a further input and a further output for the test mode. These inputs and outputs are used to connect them to one another to form a shift register, through the use of data line sections DL1 . . . DLe, which are represented by dashed lines. Thus, in the test mode, it is possible to load data through a shift register input Scan In into the connecting elements SFF1 . . . SFFm in order to apply the data, which have already been loaded into the shift register, to the function blocks FB1 . . . FBn by using a single clock pulse to switch to the normal mode. The output data from the function blocks FB1 . . . FBn are loaded into the connecting elements which follow the respective function block and can be read through the shift register and its output Scan Out, by switching to the test mode. This scan path allows each function block FB1 . . . FBn to be changed to any desired state, and to be tested individually.

Protection elements SE are disposed, according to the invention, both in the activation line Scan Enable and in the data line DL1 . . . DLe which connects the connecting elements SFF1 . . . SFFm. These protection elements SE can, as illustrated in FIGS. 2A, 2B and 2C, be either in the form of protection devices "Fuses" which can be disconnected, or in the form of connections "Anti-Fuses" which can be produced and which, for example, produce a ground short or connect the line to the supply voltage potential all the time. As a further option, these characteristics in conjunction with a logic gate allow the latter to be locked in a fixed function. These protection elements SE are distributed in a decentralized manner over the entire chip area and, after the test, allow the activation line Scan Enable, as well as the data line sections DL1 . . . DLe and therefore the scan path, to be disconnected or short-circuited a number of times.

We claim:

1. A circuit configuration, comprising:
a number of function blocks having inputs and outputs;
connections connecting said inputs and outputs of each of said function blocks to at least one other of said function blocks, said connections including at least one subset in the form of a respective interlocking element having a normal mode, a test mode, a further data input and a further data output;
an activation line for switching said interlocking element from said normal mode to said test mode;
data line sections connecting said further data inputs and outputs to one another forming a shift register from said interlocking elements to provide a scan path; and
at least one electrically programmable protection element disposed along at least one of said activation line and said data line sections for selectively interrupting and connecting a given one of said lines to a defined potential.

2. The circuit configuration according to claim 1, wherein said at least one protection element is a line section disposed in said given line for electrical disconnection.

3. The circuit configuration according to claim 1, wherein said at least one protection element is a line section to be produced electrically and being disposed between said given line and the defined potential.

4. The circuit configuration according to claim 1, wherein said at least one protection element is formed with a logic gate disposed in said given line and having another input to be irreversibly connected to a defined potential by a line section to be selectively disconnected and produced electrically for switching off said logic gate.

* * * * *